(12) United States Patent
Pons

(10) Patent No.: US 9,651,598 B2
(45) Date of Patent: May 16, 2017

(54) DEVICE AND METHOD FOR DETECTING DISCHARGES

(71) Applicant: AIRBUS OPERATIONS (S.A.S.), Toulouse (FR)

(72) Inventor: Francois Pons, Toulouse (FR)

(73) Assignee: Airbus Operations (S.A.S.), Toulouse (FR)

( * ) Notice: Subject to any disclaimer, the term of this patent is extended or adjusted under 35 U.S.C. 154(b) by 642 days.

(21) Appl. No.: 13/782,778

(22) Filed: Mar. 1, 2013

(65) Prior Publication Data

US 2013/0242088 A1 Sep. 19, 2013

Related U.S. Application Data

(63) Continuation of application No. PCT/FR2011/051995, filed on Aug. 31, 2011.

(30) Foreign Application Priority Data

Sep. 6, 2010 (FR) .................................. 10 57065

(51) Int. Cl.
*H04N 9/47* (2006.01)
*G01R 31/00* (2006.01)
*G01R 31/12* (2006.01)

(52) U.S. Cl.
CPC ......... *G01R 31/00* (2013.01); *G01R 31/1263* (2013.01)

(58) Field of Classification Search
None
See application file for complete search history.

(56) References Cited

U.S. PATENT DOCUMENTS

| | | | |
|---|---|---|---|
| 4,998,070 A | 3/1991 | Rosenberg et al. | |
| 5,728,253 A * | 3/1998 | Saito et al. | 156/345.25 |
| 7,701,578 B1 * | 4/2010 | Herring | 356/417 |
| 2007/0258090 A1 * | 11/2007 | Kwon et al. | 356/328 |

FOREIGN PATENT DOCUMENTS

| | | |
|---|---|---|
| CN | 1763520 A | 4/2006 |
| CN | 2012/25981 Y | 4/2009 |
| JP | 08285921 A * | 11/1996 |
| JP | 2009/300357 A | 12/2009 |

OTHER PUBLICATIONS

Chinese Search Report for Application No. 2011800501620 dated Aug. 6, 2014.
International Search Report and Written Opinion for PCT/FR2011/051995 dated Oct. 25, 2011.

* cited by examiner

*Primary Examiner* — James M Anderson, II
(74) *Attorney, Agent, or Firm* — Jenkins, Wilson, Taylor & Hunt, P.A.

(57) ABSTRACT

A method and a device for detecting an edge glow phenomenon in a composite panel, including at least one cable for introducing current into the said composite panel, at least one current return cable, at least one insulating panel bracketed to the composite panel, and means for detecting an edge glow on an outer surface of the said composite panel.

10 Claims, 4 Drawing Sheets

DEVICE AND METHOD FOR DETECTING DISCHARGES

CROSS-REFERENCE TO RELATED APPLICATIONS

This application is a continuation of and claims priority to PCT/FR2011/051995 filed Aug. 31, 2011 which claims the benefit of and priority to French Patent Application No. 10 57065 filed Sep. 6, 2010, the entire disclosures of which are herein incorporated by reference.

The present invention relates to the field of electrical testing, and more specifically electrical testing on a composite or other panel to study the phenomenon of edge glow.

TECHNICAL FIELD

When lightning travels over a composite panel it may generate one or more edge glows on the panel segment. This phenomenon is illustrated in FIGS. 1 and 2.

More accurately, when the lightning enters a composite panel it tends to follow the direction of the fibres. Indeed, the resin forming an insulator prevents the lightning passing from one fold to another. When the lightning arrives at the end of the panel and is in contact with air a Corona effect may occur and plasma may be formed. In certain applications, notably aeronautical applications, analyses are undertaken to better understand the formation of edge glows in composite panels. To accomplish this, lightning tests are undertaken. These tests enable the structure of a composite panel to be modelled in the light of the impact of the lightning on it, and the phenomenon of edge glow to be apprehended.

BACKGROUND

To analyse the phenomenon of edge glow points of a panel made of composite material having an edge glow probability, bearing in mind the properties of the selected material, are located by digital simulation. A lightning test is then undertaken on a composite panel. Lightning tests are currently undertaken in specialist centres, bearing in mind the required equipment. The centres use very high current lightning generators.

During the lightning test it is observed whether the location of the edge glow produced obtained by simulation was correct. An analysis of the panel after impact is also carried out. By changing the type of composite used, or the conditions under which the test is carried out, the sensitivity of the said composite to the edge glow phenomenon according to its physical characteristics, such as its drape-forming, its geometry, the thickness between folds, the thickness of the fibres, etc., are analysed. The results of the tests enable correspondences between the physical properties of the composite and the edge glow phenomenon to be deduced.

One of the problems posed by known lightning-testing systems is the unwieldy, complex and costly equipment required to undertake lightning tests. Lightning generators are bulky and require lengthy preparation before they can be used. The time to undertake the lightning test may be long, for example as long as six weeks.

In addition, since the lightning is reproduced for testing requirements, the composite panel on which the lightning strike phenomenon is tested physically is likely to be damaged significantly. This results in increased difficulties in analysing the influential parameters.

Another problem posed by current testing systems is their environmental sensitivity. The system is adjusted to make an impact at a determined location of the composite panel. But a change of degree of hygrometry can deflect the direction of the lightning and cause the test to fail.

An edge glow detection device without lightning test is described in patent application US20070258090. This document describes a device including a sample made of a composite material connected to an electric cable to produce edge glows in the sample, a mirror to reflect the edge glows emitted by the different faces of the sample to cameras or deflectors to view the edge glows, and means to analyse the light of the edge glows.

However, this device is quite complex and requires several tools to be able to view the different edge glows on several faces of the test specimen. This can also complicate the repetition of detection under the same conditions for different types of composite materials.

One aim of the invention is to provide a simplified, repeatable and robust testing system which enables the edge glow phenomenon to be demonstrated without the unwieldiness of a lightning test, and without the complexity of a current edge glow detection device.

Another aim of the present invention is to enable the time required to analyse the influential parameters in lightning tests to be reduced.

SUMMARY

The present invention relates to a device for detecting an edge glow phenomenon in a composite panel, including at least one cable for introducing current into the said composite panel, at least one current return cable, at least one insulating panel bracketed to the composite panel, and means for detecting an edge glow on an outer surface of the said composite panel.

This enables the current to be channelled in the edge glow-sensitive composite panel, and facilitates repetition of detection.

The device includes means for controlling the current flowing in the cable. This being so, the test can easily be reproduced under different electrical conditions.

According to a particular form of embodiment, two insulating panels are positioned at the two ends of the composite panel, and a third insulating panel is positioned between the said two insulating panels on one of the lengthways faces of the composite panel.

In a second embodiment of the invention the device includes an insulating material in which the composite panel is embedded such that a single face of the said composite panel is free.

According to a first form of embodiment of the invention the detection means include a camera enabling an image of the panel and an edge glow produced by the edge glow phenomenon to be stored, together with means enabling the edge glow to be located using the image.

According to a second form of embodiment the detection means include means for measuring the voltage between parallel lengthways faces of the panel.

According to a third form of embodiment the detection means include photoelectric detectors.

According to a particular form of embodiment of the invention the direction of the fibres of at least the first fold of the composite panel is different to the direction of the axis passing through the attachments of the cables on the composite panel.

The present invention also relates to a method for detecting an edge glow phenomenon in a composite panel, including the following steps:

- transmission of a current using at least one cable for introducing current into the said composite panel, where at least one insulating panel is bracketed to the composite panel;
- return of the current using at least one current return cable; and
- detection of an edge glow on an outer surface of the panel using detection means.

The method includes a step which consists in adjusting the current flowing in the composite panel using control means.

BRIEF DESCRIPTION OF THE DRAWINGS

Other aims, advantages and characteristics of the invention will be seen on reading the following description of the device according to the invention, given as a non-restrictive example with reference to the illustrations appended hereto, in which.

DETAILED DESCRIPTION

The principle of the proposed solution consists in providing a simplified device enabling the edge glow phenomenon to be demonstrated. The solution consists in using a test bench to study the phenomenon in question with ease.

Figure 1:
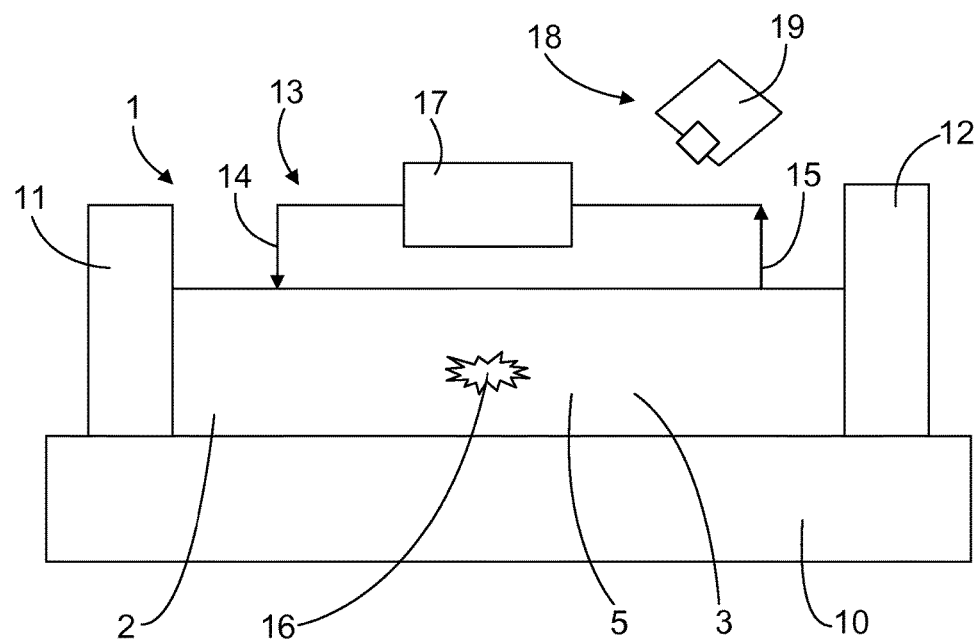
FIG. 1 represents schematically a detection device according to a first embodiment of the present invention.
Figure 2:
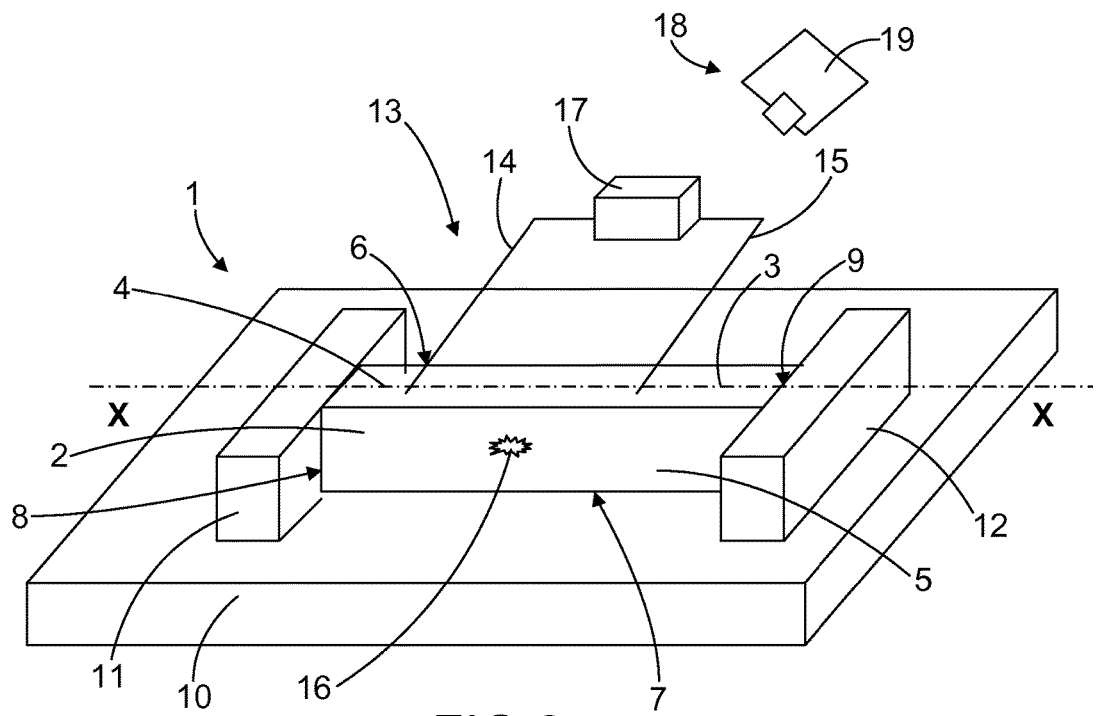
FIG. 2 represents schematically a perspective view of a detection device according to the first embodiment of the present invention.

FIGS. 1 and 2 illustrate a device 1 for detecting the edge glow phenomenon using a composite test specimen 2 according to a first embodiment. In the embodiment described below the test is undertaken with a composite material. Other types of materials sensitive to edge glow could be used such as, for example, materials consisting of layers having different conductivities. In the illustrated embodiment composite test specimen 2 includes a parallelepipedic panel 3 made of composite material. Panel 3 has four lengthways faces: one top face 4, one front face 5, one rear face 6 and one bottom face 7. The panel also has two lateral end faces: one left-hand face 8 and one right-hand face 9. Composite panel 3 is resting by its lengthways bottom face 7 on a panel 10 made of insulating material. Two panels 11, 12 made of insulating material are positioned at each lengthways end of composite panel 3, at lateral faces 8, 9. Panels 10, 11 and 12 are also parallelepipedic in shape. Panels 11 and 12 are parallel. Panel 3 is positioned between panels 11 and 12, perpendicular to each of them. Panels 3, 11 and 12 form an H-shape and are resting on base panel 10.

Electrical cables 13 enabling lightning to be simulated are attached by any type of known means to composite panel 3. A cable 14 introduces the current into composite test specimen 2: this simulates the impact of lightning on composite panel 3. Cable 14 is attached to one of the ends of panel 3, on one of the three faces not bracketed to an insulating panel 4, 5, 6. In the illustrated example cable 14 is introduced into top lengthways face 4 of panel 3. A current return cable 15 is included. Cables 14, 15 are attached to each of the lengthways ends of panel 3, on a single face, in this case face 4. In this way, when the current is introduced into panel 3 by cable 14 it must traverse the panel lengthways in order to reach return cable 15.

In an example embodiment of device 1 given purely as an illustration, and non-restrictively, the panel is 120 millimeters in length, 30 millimeters wide, and 3 millimeters thick. The current is introduced via metal bolts attached to the panel. The diameter of the bolts is 6.35 millimeters. The distance between the centres of each of the bolts is 100 millimeters. Axis X-X passing through the centre of each of the bolts is in the lengthways direction of panel 3 parallel to each of these ridges. The distance between the centre of each of the bolts and each of the lateral faces of the panel along axis X-X is 10 millimeters.

The metal bolts are attached to panel 3 with interference (i.e. the diameter of the bolt is slightly greater than the diameter of the bore), allowing control of the electrical contact resistance between the attachment and the composite material.

Insulating panels 10, 11 and 12 prevent the Corona effect in lateral faces 8, 9 or bottom lengthways face 7, and by this means force the current to pass into composite panel 3. They are positioned at each end of panel 3, in lateral faces 8, 9, and also between faces 8, 9 in bottom lengthways face 7, to prevent any bridging.

As is shown by FIG. 1, when the current passes into cable 14 an edge glow phenomenon occurs which results in an edge glow 16 on an outer surface of panel 3 which is not in contact with an insulating panel 10, 11, 12 and in the illustrated embodiment on front lengthways face 5 of panel 3.

Means 17 for controlling the electrical current flowing in cables 13 enable the current, voltage and/or frequency applied and/or the time for discharge to return cable 15 to be modified. The current goes in through the input attachment in panel 3 and exits through the output attachment. The potential difference between the two attachments generates an electrical field in the composite material. The current enters composite panel 3 and traverses it principally in the direction of the fibre folds at 0° relative to the alignment of two attachments, but also from one fold to the next in the direction of the depth of the material, which causes the edge glow when the material has poor conductivity in its depths.

Edge glow detection means 18 are installed to locate one or more edge glow(s) in panel 3. Means 18 can be of different types.

In a first form of embodiment means 18 include a photosensitive camera 19, or again a camera with a large shutter aperture. Camera 19 records panel 3 during the lightning test. The image obtained of the panel on which an edge glow occurs is analysed to determine precisely the location of an edge glow or edge glows.

In a second, unrepresented form of embodiment, means 18 include means of a known type for measuring the voltage between parallel lengthways faces of panel 3, for example, in the illustrated example, between front and rear lengthways faces 5, 6. If the voltage at a precise point increases this means that an edge glow has appeared at this point.

Detection means 18 can combine the means used in the first and second forms of embodiment and/or use any other type of technology.

Device 1 therefore enables an edge glow to be detected and located on a composite panel easily and rapidly, and repetition of the phenomenon to be facilitated.

By digital simulation material, configurations for which the risks of edge glow are lower are selected; the risks are identified and they are located. The results obtained by digital simulation are compared with the results obtained with detection device 1.

Device 1 has the following advantages:

Device 1 enables a rapid conclusion to be obtained as to the results obtained by digital simulation. If these results are positive lightning tests of a known type are then conducted to study the effects in a real situation.

If the real results do not match the results obtained by simulation it may indeed be that the material is sensitive to the edge glow phenomenon. By this means, the conduct of a lightning test in a real situation, which would provide far fewer results, bearing in mind the greater damage to panel 3, which proves to be more sensitive, is avoided.

It is easy to reproduce tests rapidly with different material configurations or electrical characteristics. The composite panel needs merely be changed, or the current control means need merely be controlled in a different manner.

In the previously described configuration case the edge glow phenomenon is limited. Indeed, since the current traverses the test specimen in the fibres at 0°, only a small amount of current passes from one fold to the next. And the phenomenon is heightened when the current passes down into the depths through folds of different alignments.

By using a material having a first fold of fibres aligned in a direction different to the lengthways direction, the current is forced to pass from one fold to the next. The edge glow phenomenon is demonstrated in a more pronounced manner. According to an example embodiment panel 3, the X-X axis of the two attachments of which is in the same direction as the fibres at 0°, can be replaced by a panel having no fibre in the same direction as axis X-X, for example for a composite with quasi-isotropic drape-forming the axis of both attachments would be at 22.5° from the direction of the fibres at 0°.

Similarly, using control means 17, the current, voltage, current frequency and/or stress time which passes in panel 3 can be modified easily.

Figure 3:
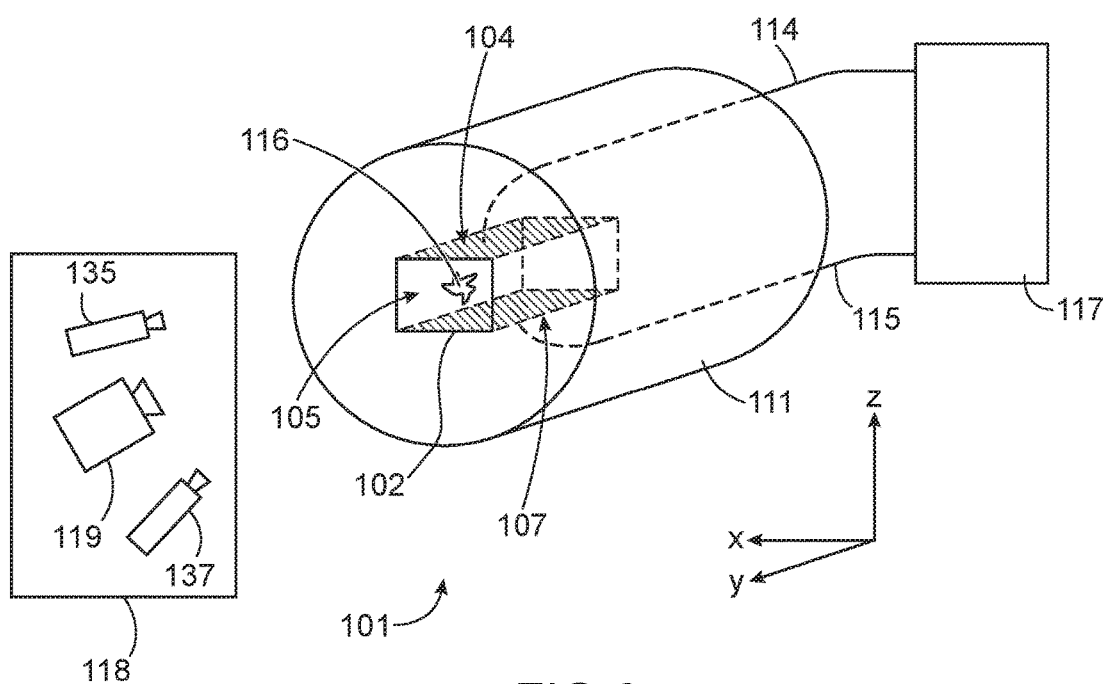
FIG. 3 represents schematically a detection device according to a second embodiment of the present invention.

FIG. 3 illustrates another embodiment of device 101 for detecting the edge glow phenomenon.

This device 101 includes a test specimen or composite panel 102 incorporated in an electrically insulating material 111 such that at least one face of composite test specimen 102 is free, means 118 for detecting an edge glow, and means 117 for controlling the current.

Figure 4:
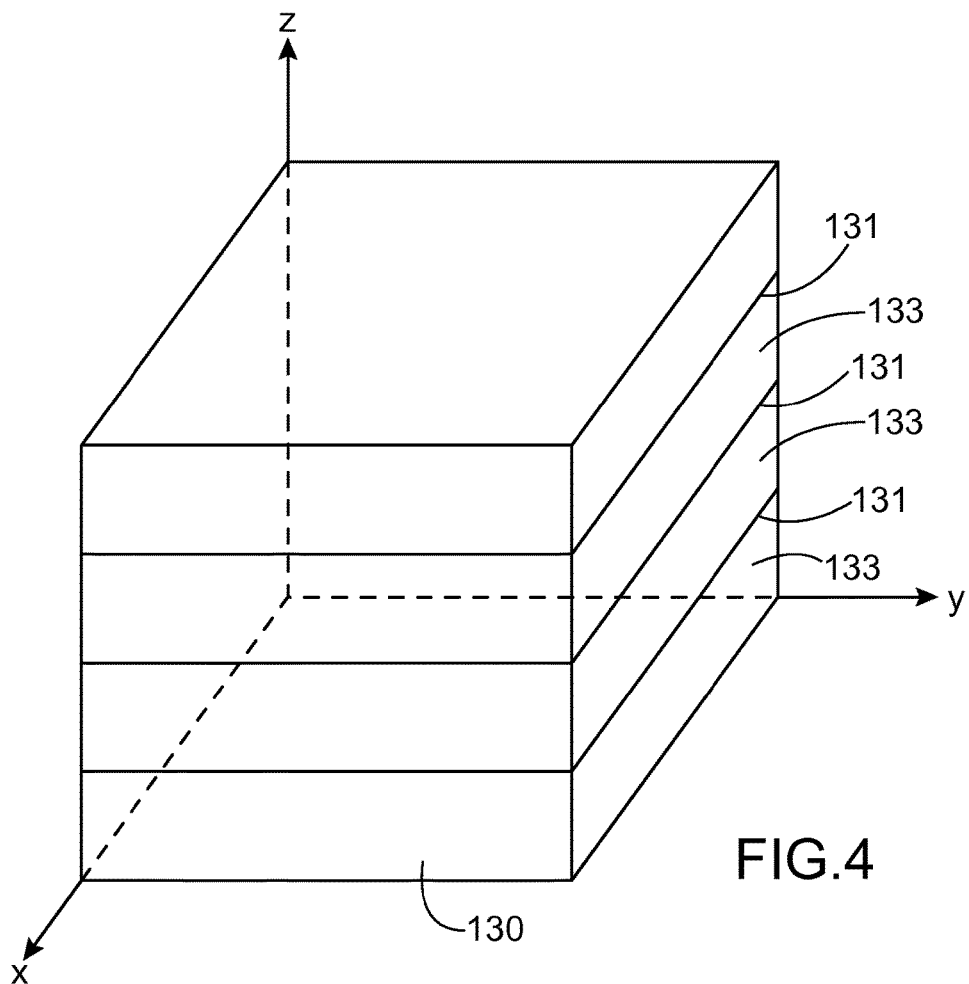
FIG. 4 represents schematically a composite material consisting of a stack of layers.

FIG. 4 illustrates a laminated composite material 130 consisting of a stack of fibre-reinforced layers 131, separated by resin matrices 133. Each reinforcing layer 131 has an inherent alignment relative to a reference system (x, y, z) common to all the layers of material. According to this example, layers 131 are located in planes (x, y) and are consequently stacked in direction z.

In the example of FIG. 3 a test specimen or composite panel 102 of parallelepipedic shape extracted from composite material 130 is used, the dimensions of which are of the order of several mm in directions x and z and some ten mm in direction y relative to reference system (x, y, z). In addition, five faces of composite panel 102 are entirely surrounded by the insulating material, and a single front face 105 located in plane (x, z) is free.

More specifically, a parallelepipedic composite panel 102, of dimensions 5 mm, 20 mm, and 4 mm in directions x, y, and z respectively, is used. Composite panel 102 is embedded in an insulating material 111 of cylindrical shape, the diameter of which is approximately 30 mm in plane (x, z), and the height of which is approximately 40 mm in direction y. Insulator 111 can of course be of any other shape, for example of parallelepipedic shape, the dimensions of which are approximately 30 mm, 40 mm, and 30 mm in directions x, y, and z respectively.

Composite panel 102 has a metal coating or deposit for example, made of chemical or electrolytic nickel on opposite first and second faces 104, 107, which are parallel to layers 131 of the composite material. In the example of FIG. 3 these electroplated faces 104, 107 are the top and bottom faces located in plane (x, y) relative to reference system (x, y, z) and in contact with insulator 111.

In addition, first and second cables 114, 115 are attached (for example by bonding) to these first and second faces 104, 107 respectively. In the illustrated example the first cable 114 introduces the current into first top electroplated face 104 of composite panel 102 and second cable 115 recovers the current from second bottom electroplated face 107 of panel 102.

The fibres between two successive layers 131 of composite panel 102 can be considered as points. When the electrical field between two successive layers exceeds critical breakdown field (of the order of some ten kV/cm), an electrical arc is thus established through matrix 133 between the two layers in direction z. The electrical arc results in an edge glow 116 in free face 105 of composite panel 102 which is not in contact with insulator 111.

As above, means 117 for controlling the electrical current flowing in cables 114, 115 enable the current, voltage and/or frequency applied and/or the time for discharge to return cable 115 to be modified. The current goes into first electroplated face 104 by means of injection cable 114, traverses it in direction z from one layer 131 to the next through matrix 133, which causes the edge glow in free face 105 of composite panel 102, and exits through second electroplated face 107 by means of return cable 115.

The electrical connection between electroplated first and second faces 104, 107 by means of injection cable 114 and return cable 115 thus imposes the establishment of a stable conductive path or channel for the current to flow between these two faces 104, 107, by this means facilitating repeatability of the detection of the edge glow phenomenon in different types or different batches of composite materials.

In addition, insulator 111 forces the passage of the current only in free face 105, enabling detection to be facilitated, and to an even greater degree repeatability of the test. Indeed, the Corona effect does not occur in the five faces embedded in insulator 111.

In addition, edge glow detection means 118 are installed to locate one or more edge glow(s) in free face 105.

As above, in a first form of embodiment these means 118 include a photosensitive camera 119, or again a camera with a large shutter aperture.

In a second form of embodiment, means 118 include means for measuring the voltage between parallel faces of composite panel 102.

In a third form of embodiment means 118 include infrared photoelectric detectors 135 and/or ultraviolet photoelectric detectors 137 positioned opposite free face 105, and aligned to detect the edge glows emitted by this surface. As an example, infrared detector 135 enables the temperature of free face 105 to be determined, and ultraviolet detector 137 enables the presence of plasma in free face 105 to be determined.

The data obtained by photoelectric detectors 135, 137 is analysed to determine the characteristics of the edge glows (location, intensity, energy, duration, spectral analysis, etc.) according to different electrical voltages, different environmental parameters (pressure, temperature, humidity, etc.) and/or different types of composite materials.

Detection means 118 can combine the means used in the first, second and third forms of embodiment and/or use any other type of technology.

Figure 5:
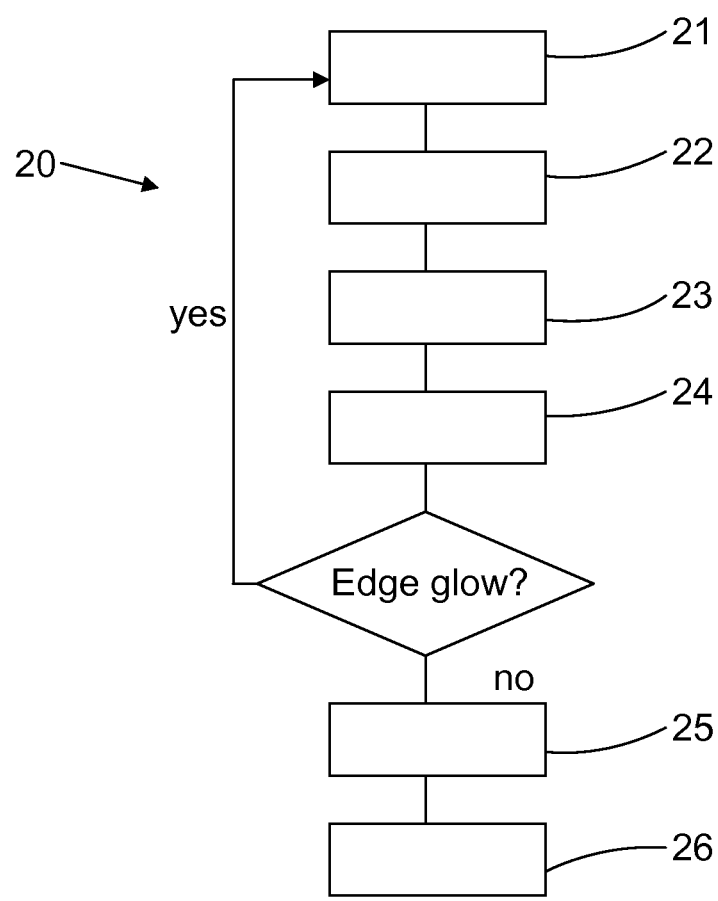
FIG. 5 is a diagram representing the different steps of the analysis method using the detection device according to the present invention.

The analysis method is then simplified. Using analysis device 1, 101 it is easy rapidly to test different configurations of materials, and also different forms of electrical current. Analysis method 20 is represented in FIG. 5. The method includes a first modelling step 21 which consists in modelling the composite material in a certain manner, and in choosing, on the basis of this modelling, a type of material having a low risk of edge glow. In a second simulation step 22 a digital simulation of the lightning strike on the selected modelled composite panel is undertaken. In the course of a third testing step 23 forming the object of the present patent application, a test using detection device 1, 101 is undertaken. One or more edge glow(s) is/are detected and located. A step 24 of expert appraisal is then undertaken to ascertain whether or not the model used was correct. The number and location of the edge glows are compared to the findings obtained by digital simulation.

In this manner, after the testing and expert appraisal steps, it is ascertained whether the modelling of the selected material was correct, and whether or not the material was in fact sensitive to the edge glow phenomenon. If it is ascertained that the selected modelled material is in fact insensitive to the edge glow phenomenon the lightning tests can then be undertaken (step 25). The more unwieldy and more expensive lightning tests are undertaken only on the materials selected using device 1, 101 according to the present invention.

In a final step 26 the expert appraisal of the results obtained with the lightning test is undertaken. Correspondences between the physical properties of the material as modelled and the edge glow phenomenon are deduced from it.

The invention claimed is:

1. A device for detecting an edge glow phenomenon in a composite panel, the device comprising:
    at least one cable for introducing current into the composite panel;
    at least one current return cable;
    at least one insulating panel in direct physical contact with the composite panel such that at least one face of the composite panel is free and not in contact with the at least one insulating panel; and
    a detector configured to detect an edge glow on an outer surface of the composite panel.

2. The device according to claim 1, further comprising a controller configured to control the current flowing in the at least one cable.

3. The device according to claim 1, wherein the at least one insulating panel comprises two insulating panels positioned at both ends of the composite panel and in that a third insulating panel is positioned between the two insulating panels on one of lengthways faces of the composite panel.

4. The device according to claim 1, wherein the at least one insulating panel comprises an insulating material in which the composite panel is embedded such that a single face of the composite panel is free.

5. The device according to claim 1, wherein the detector comprises a camera enabling an image of the composite panel and an edge glow produced by the edge glow phenomenon to be stored, together with a location device configured to locate the edge glow using the image.

6. The device according to claim 1, wherein the detector comprises a measurement device configured to measure voltage between parallel lengthways faces of the composite panel.

7. The device according to claim 1, wherein the detector comprises photoelectric detectors.

8. The device according to claim 1, wherein the composite panel is configured such that a direction of fibres of at least a first fold of the composite panel is different to a direction of an axis passing through attachments of the cables on the composite panel.

9. A method for detecting an edge glow phenomenon in a composite panel, the method comprising:
    introducing, using at least one current transmitting cable, current into the composite panel, wherein at least one insulating panel is in direct physical contact with the composite panel such that at least one face of the composite panel is free and not in contact with the at least one insulating panel;
    returning, using at least one current return cable, the current; and
    detecting, using a detector, an edge glow on an outer surface of the composite panel.

10. The method according to claim 9, further comprising adjusting the current flowing in the composite panel using a controller.

* * * * *